United States Patent
Tsukamoto

(10) Patent No.: US 9,331,512 B2
(45) Date of Patent: May 3, 2016

(54) POWER CONTROL DEVICE AND POWER CONTROL METHOD FOR MEASURING OPEN-CIRCUIT VOLTAGE OF BATTERY

(71) Applicant: Nissan Motor Co., Ltd., Yokohama-shi, Kanagawa (JP)

(72) Inventor: Yukari Tsukamoto, Sagamihara (JP)

(73) Assignee: Nissan Motor Co., Ltd., Yokohama (JP)

(*) Notice: Subject to any disclaimer, the term of this patent is extended or adjusted under 35 U.S.C. 154(b) by 0 days.

(21) Appl. No.: 14/395,072

(22) PCT Filed: Mar. 26, 2013

(86) PCT No.: PCT/JP2013/058680
§ 371 (c)(1),
(2) Date: Oct. 17, 2014

(87) PCT Pub. No.: WO2013/168474
PCT Pub. Date: Nov. 14, 2013

(65) Prior Publication Data
US 2015/0077063 A1 Mar. 19, 2015

(30) Foreign Application Priority Data

May 11, 2012 (JP) .................................. 2012-108975

(51) Int. Cl.
*H02J 7/04* (2006.01)
*H02J 7/00* (2006.01)
(Continued)

(52) U.S. Cl.
CPC ............... *H02J 7/007* (2013.01); *B60L 3/0069* (2013.01); *B60L 3/04* (2013.01); *B60L 8/003* (2013.01);
(Continued)

(58) Field of Classification Search
CPC ......... Y04S 10/54; Y04S 10/14; Y04S 20/14; Y04S 50/10; Y04S 20/12; Y04S 10/12; Y04S 20/221; Y04S 10/26; Y04S 20/24; Y04S 20/242; Y04S 20/248; Y02E 60/722; Y02E 10/566
See application file for complete search history.

(56) References Cited

U.S. PATENT DOCUMENTS

| 6,249,124 B1 | 6/2001 | Bertness | |
| 2012/0176095 A1* | 7/2012 | Okuda | H01M 10/44 320/134 |

(Continued)

FOREIGN PATENT DOCUMENTS

| CN | 102253342 A | 11/2011 |
| JP | 2003-291754 A | 10/2003 |

(Continued)

*Primary Examiner* — Yalkew Fantu
*Assistant Examiner* — Manuel Hernandez
(74) *Attorney, Agent, or Firm* — Global IP Counselors, LLP

(57) ABSTRACT

A power control device includes a relay switch, a controller, a sensor and a battery controller. The relay switch is configured to turn electricity on and off between a battery for supplying a load with electric power and the load. The controller predicts load power characteristics indicating characteristics of power consumed by the load over time, and predicts, based on the predicted load power characteristics, charge/discharge power characteristics indicating characteristics of charge/discharge power of the battery over time. The sensor detects voltage between the terminals of the battery. The controller specify a voltage detection period from the charge/discharge power characteristics that was predicted, over which the charge/discharge power of the battery is equal to or less than a prescribed power over a prescribed period. The battery controller turns off the relay switch and detects the voltage between the battery terminals during the voltage detection period.

19 Claims, 7 Drawing Sheets

(51) Int. Cl.

| | | |
|---|---|---|
| *G01R 31/36* | (2006.01) | |
| *B60L 3/00* | (2006.01) | |
| *B60L 3/04* | (2006.01) | |
| *B60L 8/00* | (2006.01) | |
| *B60L 11/14* | (2006.01) | |
| *B60L 11/18* | (2006.01) | |
| *H02J 7/35* | (2006.01) | |
| *G01R 31/40* | (2014.01) | |

(52) U.S. Cl.
CPC .............. *B60L 11/14* (2013.01); *B60L 11/184* (2013.01); *B60L 11/1816* (2013.01); *B60L 11/1824* (2013.01); *B60L 11/1844* (2013.01); *B60L 11/1846* (2013.01); *G01R 31/362* (2013.01); *H02J 7/35* (2013.01); *H02S 50/00* (2013.01); *B60L 11/1861* (2013.01); *B60L 2210/30* (2013.01); *B60L 2210/40* (2013.01); *B60L 2240/547* (2013.01); *B60L 2260/44* (2013.01); *G01R 31/3693* (2013.01); *H02J 7/00* (2013.01); *Y02E 60/721* (2013.01); *Y02T 10/70* (2013.01); *Y02T 10/7005* (2013.01); *Y02T 10/7077* (2013.01); *Y02T 10/7083* (2013.01); *Y02T 10/7241* (2013.01); *Y02T 90/121* (2013.01); *Y02T 90/127* (2013.01); *Y02T 90/128* (2013.01); *Y02T 90/14* (2013.01); *Y02T 90/163* (2013.01); *Y02T 90/169* (2013.01); *Y04S 10/126* (2013.01); *Y04S 30/14* (2013.01)

(56) References Cited

U.S. PATENT DOCUMENTS

| | | | |
|---|---|---|---|
| 2012/0229077 A1* | 9/2012 | Tsuchiya | H02J 3/32 320/107 |
| 2013/0134940 A1* | 5/2013 | Tominaga | B60L 11/1846 320/109 |
| 2013/0285446 A1* | 10/2013 | Chow | H02J 3/32 307/18 |
| 2014/0330473 A1* | 11/2014 | Miyashita | B60L 7/10 701/22 |

FOREIGN PATENT DOCUMENTS

| | | |
|---|---|---|
| JP | 2008-82887 A | 4/2008 |
| JP | 2009-284586 A | 12/2009 |
| JP | 2010-183679 A | 8/2010 |
| JP | 2012-18098 A | 1/2012 |
| JP | 2012-60775 A | 3/2012 |
| WO | 2009/084821 A2 | 7/2009 |
| WO | 2012/057305 A1 | 5/2012 |

* cited by examiner

POWER CONTROL DEVICE AND POWER CONTROL METHOD FOR MEASURING OPEN-CIRCUIT VOLTAGE OF BATTERY

CROSS-REFERENCE TO RELATED APPLICATIONS

This application is a U.S. National stage application of International Application No. PCT/JP2013/058680, filed Mar. 26, 2013, which claims priority to Japanese Patent Application No. 2012-108975 filed in Japan on May 11, 2012. The entire disclosure of Japanese Patent Application No. 2012-108975 is hereby incorporated herein by reference.

BACKGROUND

1. Field of the Invention

The present invention relates to a device and method for controlling electric power.

2. Background Information

Electric power source devices for vehicles have been known in which, in a vehicle traveling by selectively using an engine and a motor generator as a drive source, a power source relay for supplying and cutting off electric power to the motor generator from a 42V line power source (battery), which acts as a drive power source to the motor generator, is connected between the 42V line power source and an inverter, and during travel under engine power, the power source relay is turned off within a prescribed period and the open-circuit voltage (OCV) of the 42V line power source is measured (e.g., Japanese Laid-Open Patent Application No. 2003-291754).

SUMMARY

In a vehicle traveling by selectively using an engine and a motor generator as described above, the power source relay is turned off in order to measure the open-circuit voltage (OCV) of the battery during travel under engine power, whereby vehicle travel is not affected even when the electric power supply from the battery to the motor generator (the load) is turned off. However, in a battery used outside of a vehicle, such as, e.g., an accumulator for supplying electric power to a load in a house or a facility, there has been the problem that the supply of electric power to the load becomes unstable when the supply between the battery and the load is turned off at an arbitrarily defined time in order to detect the open-circuit voltage of the battery.

The present invention provides a device and method for controlling electric power which prevent a supply of electric power to a load from becoming unstable by detecting the open-circuit voltage of a battery.

In order to achieve the above objective, the present invention predicts charge/discharge power characteristics indicating characteristics of the charge/discharge power of a battery over time; specifies from the predicted charge/discharge power characteristics a period, as a voltage detection period, over which the charge/discharge power of the battery is equal to or less than a prescribed power over a prescribed period; and, within the voltage detection period, turns off a switching means connected between a load and the battery in order to detect the open-circuit voltage of the battery.

According to the present invention, because the switching means is turned off and the open-circuit voltage is detected within a period over which the charge/discharge power from the battery to the load is equal to or less than a prescribed power, the effect of preventing the supply of electric power from becoming unstable due to detection of the open-circuit voltage of the battery can be achieved.

BRIEF DESCRIPTION OF THE DRAWINGS

Referring now to the attached drawings which form a part of this original disclosure.

DETAILED DESCRIPTION OF THE EMBODIMENTS

A preferred embodiment of the present invention is described below based on the drawings.

Embodiment 1

Figure 1:
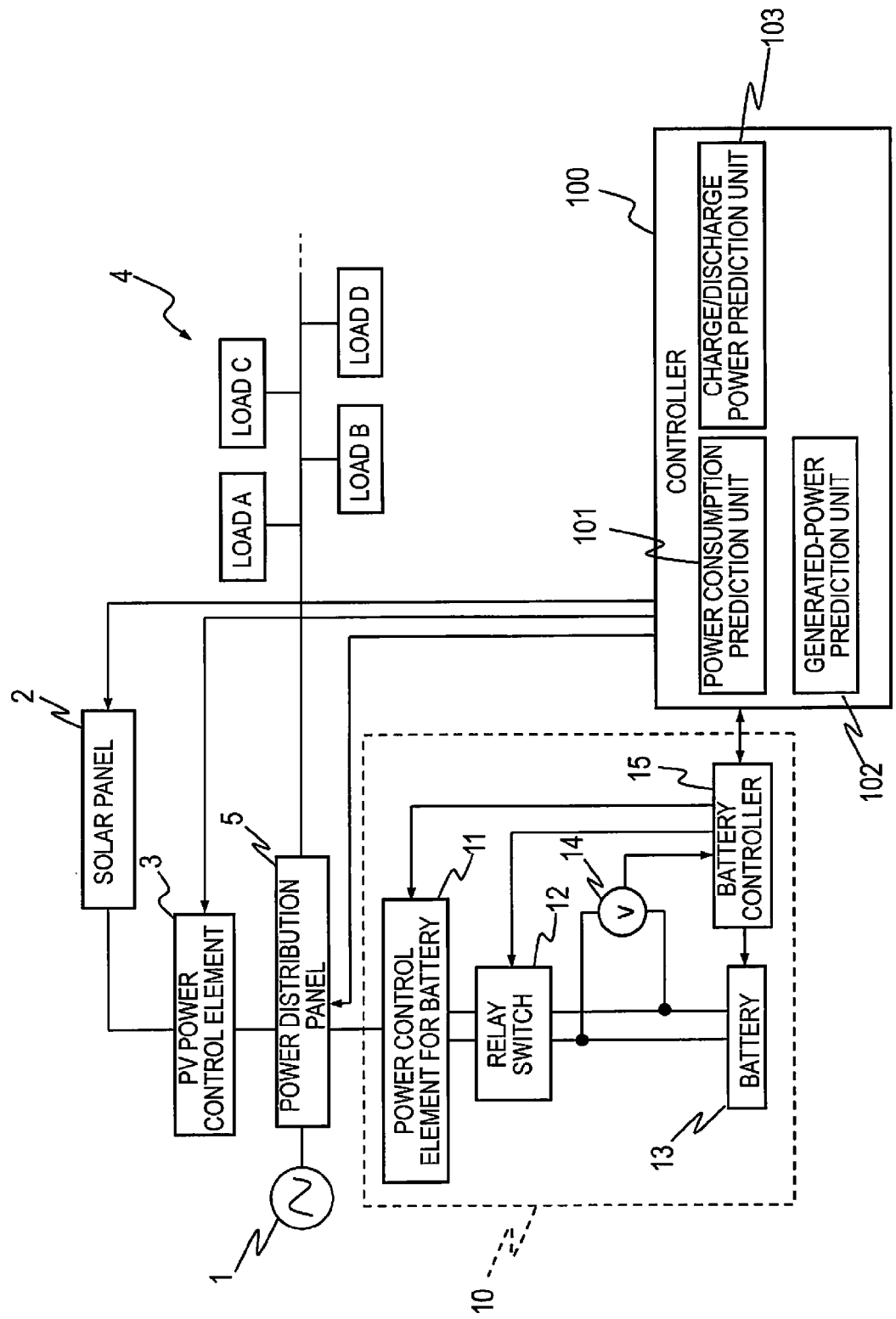
FIG. 1 is a block diagram of a device for controlling electric power according to an embodiment of the present invention.

FIG. 1 is a block diagram of the device for controlling electric power of the present invention. The device for controlling electric power in the present example is a device, provided indoors or outdoors for residential use, for controlling the electric power of a load. The device for controlling electric power comprises an alternating-current power source 1, a solar panel 2, a PV power control element 3, loads 4, a power distribution panel 5, an accumulator 10, and a controller 100. The directional lines in the drawing are lines of control, and the other solid lines are power lines. Only the power lines inside the accumulator 10 are drawn with respectively positive and negative power lines (two power lines); the power lines outside the accumulator 10 are drawn with single solid lines indicating the positive and negative power lines together for the sake of convenience.

The alternating-current power source 1 is a commercial power source distributed to each residence from an electric power company. The alternating-current power source 1 is capable of supplying the loads 4 with electric power for 24 hours. The solar panel 2, being installed on the roof of the house or at a similar location, converts solar energy into electricity by using a solar cell and supplies the loads 4 with electric power as a power-generating device.

The PV power control element 3 comprises an electric power converter or the like, and converts direct-current power generated by the solar panel 2 into alternating-current power before supplying the power distribution panel 5 with the converted power. Because the electric power generated by the solar panel 2 varies depending on the weather or the like, the PV power control element 3 controls the outputted electric power from the solar panel 2 so that, in accordance with the output from the solar panel 2, the outputted electric power will be suitable for supply to the loads 4. The PV power control element 3 is connected between the solar panel 2 and the power distribution panel 5 by power lines.

The loads 4 include loads A through D, which are air conditioners, televisions, water heaters, and other home appliances used in a residence. The power consumed by the loads 4 changes in accordance with the state of use of loads A through D or the like by a user. The loads 4 are connected to the power distribution panel 5 by power lines wired indoors. The power distribution panel 5 is a device for distributing and supplying, to the loads 4, electric power supplied from the alternating-current power source 1, the solar panel 2, and a battery 13.

The accumulator 10 comprises a power control element 11 for a battery, a relay switch 12, a battery 13, a voltage sensor 14, and a battery controller 15. In order to suppress the amount of electric power consumed from the alternating-current power source used in the residence, the accumulator 10 stores in advance a portion of the electric power to be consumed by the loads 4.

The power control element 11 for the battery comprises an electric power converter or the like, and converts direct-current power outputted from the battery 13 into alternating-current power before supplying the loads 4 with the converted power via the distribution panel 5. In the present example, when the battery 13 is charged using electric power from the alternating-current power source 1 and the solar panel 2, the power control element 11 for the battery functions as a charge element, converting the electric power from the alternating-current power source 1 and the solar panel 2 into charging power suitable for charging the battery 13 and supplying the battery 13 with the charging power.

The relay switch 12 is a switch for switching between turning electricity on and off between the loads 4 and the battery 13, and is connected between the loads 4 and the battery 13 via the power distribution panel 5 and the power control element 11 for the battery. The relay switch 12 switches on and off by control of the battery controller 15.

In the battery 13, a plurality of lithium ion cells or other secondary cells are connected. The battery 13 may be a battery previously used for an electric automobile or other vehicle, reused as a stationary battery. The voltage sensor 14 is connected to both ends of the battery 13, and detects the voltage of the battery 13.

The battery controller 15 manages the battery 13. The battery controller 15 uses the voltage sensor 14 to detect the voltage of the battery 13, thereby measuring the state of charge (SOC) of the battery 13. Because the battery 13 is degraded with use, the battery controller 15 manages the level of degradation of the battery 13, the capacity of the battery 13 when fully charged, and the like. The level of degradation of the battery 13 may be measured by computing the internal resistance of the battery 13. The battery controller 15 may use a current sensor (not shown) for detecting a charge/discharge current for the battery 13 to measure the state of charge or the like of the battery 13.

In addition to managing and controlling the battery 13, the battery controller 15 controls the power control element 11 for the battery and the on/off control of the relay switch 12. When electric power from the battery 13 is supplied to the loads 4, the battery controller 15 controls the power control element 11 for the battery, causing the power control element 11 for the battery to convert the power discharged from the battery 13 into electric power suitable for supply to the loads 4 and output the electric power to the power distribution panel 5. However, when electric power from the solar panel 2 or the alternating-current power source 1 is supplied to the battery 13, the battery controller 15 exerts control so that the power control element 11 for the battery is used as a charge element, converts the electric power generated by the solar panel 2 or the electric power from the alternating-current power source 1 into electric power suitable for charging the battery 13, and outputs the converted power to the battery 13. During control of the discharging or charging of the battery 13, the battery controller 15 uses the voltage detected by the voltage sensor 14 and the value detected by the current sensor (not shown) to manage the electric power of the battery 13.

When detecting the open-circuit voltage of the battery 13, the battery controller 15 turns the relay switch 12 off for a prescribed period in order to keep the battery 13 in an unloaded state. With the relay switch 12 in a turned-off state, the battery controller 15 then detects the open-circuit voltage of the battery 13 by detecting the voltage of the battery 13 using the voltage sensor 14. While the accumulator 10 is being used as a power source for the residence, other than when the open-circuit voltage of the battery 13 is detected, the accumulator 10 is subjected to maintenance, or in other such circumstances, the battery controller 15 maintains the turned-on state of the relay switch 12.

The battery controller 15 is connected to the controller 100 by a signal line. Information about the SOC or the like of the battery 13 managed by the battery controller 15 is transmitted to the controller 100. The battery controller 15 controls, based on a control signal from the controller 100, the power control element 11 for the battery and the on/off control of the relay switch 12. The battery controller 15 may be provided to the controller 100 as described below. Specifically, the controller 100 may be designed so as to comprise the function of the battery controller 15, directly manage and control the battery 13, and directly control the power control element 11 for the battery and the relay switch 12.

The controller 100 controls the solar panel 2, the PV power control element 3, and the power distribution panel 5, and in the present example also controls the entire device for controlling electric power. The controller 100 has a power consumption prediction unit 101, a generated-power prediction unit 102, and a charge/discharge power prediction unit 103.

The power consumption prediction unit 101 ascertains the state of use of the loads 4 over time, and predicts the electric power that will be consumed by the loads 4 from the past states of use. The power consumption of the loads 4 exhibits a particular tendency in accordance with the season, weather conditions, the time slot in which the loads 4 are used, and the like. The tendency of the power consumption can be ascertained from the past usage history of power consumption. The power consumption prediction unit 101 stores the values over time from a meter (not shown) for calculating the amount of electric power consumed, and predicts the power characteristics of the electric power consumed by the loads 4 (called "load power characteristics" hereinbelow) over time.

The generated-power prediction unit 102 predicts the characteristics of electric power generated by the solar panel 2 (called "generated-power characteristics" hereinbelow) over time. The electric power generated by the solar panel 2 is determined by the performance and installation position of the solar panel 2 as well as weather conditions or the like. The performance and installation position of the solar panel 2 are determined in advance. Data from, e.g., the weather bureau is used for the weather conditions. The generated-power prediction unit 102 stores past weather data and the electric power generated by the solar panel 2 correspondingly with respect to time. The generated-power prediction unit 102 then predicts the power that will be generated by the solar panel 2 by extracting data about past power transitions which matches the information from the weather forecast.

The charge/discharge power prediction unit 103 predicts the characteristics of the charge/discharge power of the battery 13 (called "charge/discharge power characteristics" hereinbelow) over time. The charge/discharge power of the battery 13 is determined by the power generated by the solar panel 2 and the power consumed by the loads 4. The charge/discharge power prediction unit 103 predicts the charge/discharge power characteristics from the load power characteristics predicted by the power consumption prediction unit 101 and the generated-power characteristics predicted by the generated-power prediction unit 102.

The controller 100 specifies, from the charge/discharge power characteristics predicted by the charge/discharge power prediction unit 103, a period in which the supply of electric power to the loads 4 will not become unstable due to the turning off of the relay switch 12.

Here, the timing of the relay cutoff for turning the relay switch 12 off in order to detect the open-circuit voltage of the battery 13 is described. In a case in which, e.g., the battery 13 is used as a power source for a hybrid vehicle, causing the vehicle to travel under engine power removes the load on the battery 13. The traveling of the vehicle is therefore unaffected even when the relay switch 12 between the battery 13 and a motor or another load is turned off. In a case in which the battery 13 is used as a power source for an electric automobile or other vehicle, the battery goes into an unloaded state when the vehicle stops. Therefore, during vehicle stopping, the open-circuit voltage can similarly be detected when the relay switch 12 is turned off.

As described above, in the present example, the battery 13 is provided to the accumulator 10 which is an electric power source device for a residence, and is used as an electric power source for supplying the loads 4 with electric power. Because the timing at which the electric power is consumed by the loads 4 depends on the state of use by a user, and differs for each user, the relay switch 12 is preferably in a turned-on state under normal circumstances in order to stabilize the power supply to the loads 4. When the relay switch 12 is turned off at an arbitrarily defined time merely to detect the open-circuit voltage of the battery 13, the supply of power to the loads 4 may become insufficient, and a sense of discomfort may be created in a user. Therefore, in the present example as described above, a voltage detection period for detecting the voltage outputted by the battery 13 is specified from the power characteristics and the relay switch 12 is turned off to detect the open-circuit voltage.

The control matter of the device for controlling electric power of the present example will be described next. First, the control over the electrical power system will be described. In the present example as described below, power control is performed by effectively applying the electric power from the battery 13 and the electric power from the solar panel 2 so that the electric power supplied from the alternating-current power source 1 is suppressed.

In a case in which the electric power generated by the solar panel 2 is greater than the electric power consumed by the loads 4, the controller 100 exerts control so that the battery 13 is charged using the surplus electric power generated by the solar panel 2 while supplying the loads 4 with the electric power generated by the solar panel 2. In a case in which the electric power generated by the solar panel 2 is less than the electric power consumed by the loads 4, the controller 100 exerts control so that electric power in the amount by which the solar panel 2 is insufficient is discharged from the battery 13 and supplied to the loads 4 while supplying the loads 4 with the electric power generated by the solar panel 2.

During a time slot in which the cost of electricity from the alternating-current power source 1 is high, the controller 100 uses the electric power generated by the solar panel 2 and the electric power with which the battery 13 is charged so as to suppress the use of electric power from the alternating-current power source 1. During a time slot in which the cost of electricity from the alternating-current power source 1 is low (e.g., during the midnight-power time slot), the controller 100 supplies the loads 4 with electric power from the alternating-current power source 1.

In a case in which a small amount of electric power generated by the solar panel 2 or a high amount of electric power consumed by the loads 4 during the day is predicted by the generated-power characteristics and the load power characteristics, the controller 100 controls the battery controller 15 so that the battery 13 is charged during the midnight-power time slot in which the cost of electricity is low.

Figure 2:
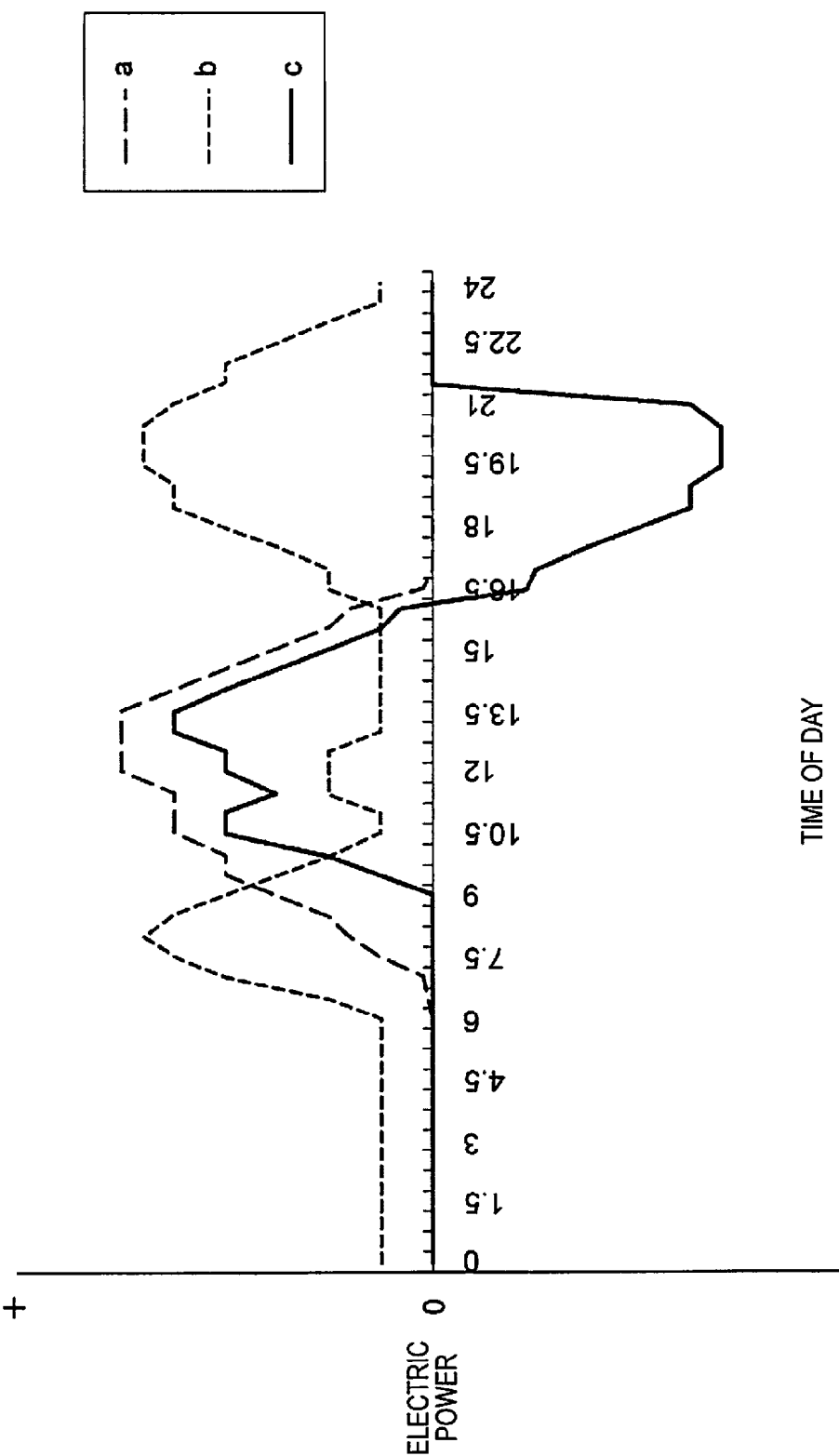
FIG. 2 is a graph showing the generated-power characteristics, the load power characteristics, and the charge/discharge power characteristics of the device for controlling electric power in FIG. 1.
Figure 3:
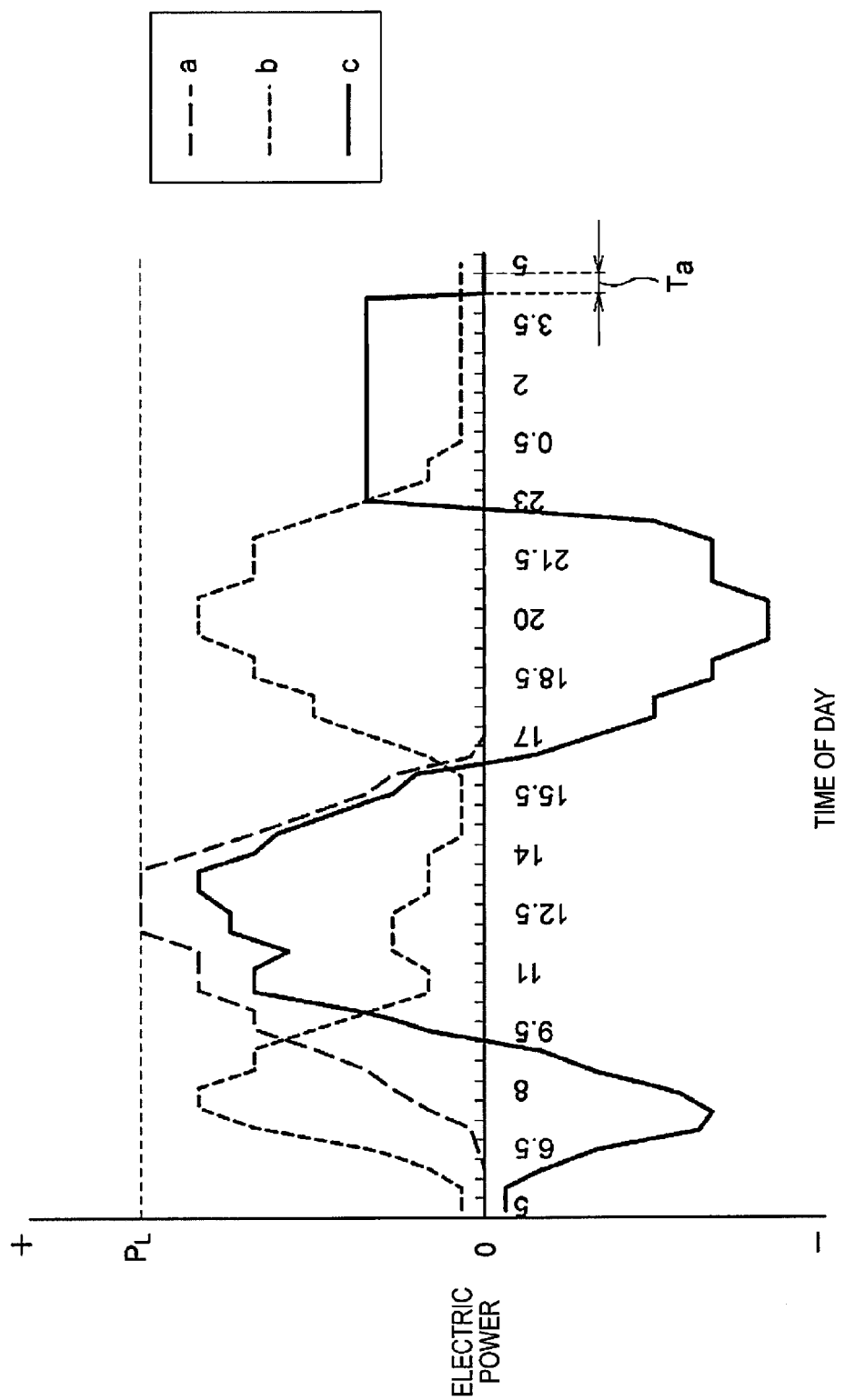
FIG. 3 is a graph showing the generated-power characteristics, the load power characteristics and the charge/discharge power characteristics of the device for controlling electric power in FIG. 1.

FIGS. 2 and 3 show the generated-power characteristics, the load power characteristics, and the charge/discharge power characteristics on certain days. In FIGS. 2 and 3, graph a shows the generated-power characteristics, graph b shows the load power characteristics of the loads 4, and graph c shows the charge/discharge power characteristics of the battery. In graph c, the power characteristics on the positive side indicate charging, and the power characteristics on the negative side indicate discharging. On the day shown in FIG. 2, a constant amount of electric power is consumed by the loads 4 between 0:00 (0:00 AM) and 6:00. Because this is a time slot in which the cost of electricity is low, the loads 4 are operated using the electric power from the alternating-current power source 1. Then, because the electric power generated by the solar panel 2 is greater than the power being consumed by the loads 4 between 6:00 and 16:30, the battery is charged during this time slot. From 16:30 until 21:00, the loads 4 are operated using the electric power with which the battery 13 was charged. Then, from 21:00 onward, the loads 4 are operated using the electric power from the alternating-current power source 1.

The power characteristics on the day shown in FIG. 3 will be described next. The initial state is a state in which the battery 13 is fully charged. From 5:00 onward (5:00 AM onward), the solar panel 2 generates electric power, but because the power consumed by the loads 4 cannot be fulfilled merely by the electric power from the solar panel 2, the controller 100 outputs a control signal to the battery controller 15, and the power control element 11 for the battery supplies the loads 4 with electric power from the battery 13 based on a command from the battery controller 15. At 9:30, the electric power generated by the solar panel 2 is greater than the electric power consumed by the loads 4, and from 9:30 until 16:30, the battery 13 is charged using the electric power from the solar panel 2. From 16:30 onward, because the electric power generated by the solar panel 2 is less than the electric power consumed by the loads 4, the loads 4 are operated using the electric power from the battery.

In a case in which it is determined, from the load power characteristics of the loads for the next day and the generated-power characteristics for the next day, that the electric power generated by the solar panel 2 and the electric power with which the battery 13 is charged cannot equal the power demand for the next day, the battery 13 is charged during a time slot in which the electric power consumed by the loads 4 is low (or a time slot in which the cost of electricity is low). As shown in FIG. 3, from 23:00 onward, the battery 13 is charged using electric power from the alternating-current power source 1. At 3:00, the SOC of the battery 13 reaches a target SOC, and the charging ends. The battery 13 is thereby charged during a time slot in which the cost of electricity is low, and is made to equal the power demand for the next day.

Thus, the controller 100 raises the usability of the electric power generated by the solar panel 2 and the electric power with which the battery 13 is charged and suppresses the usability of the electric power from the alternating-current power source 1 while predicting the load power characteristics and the generated-power characteristics. Furthermore, the controller 100 controls the power control element 11 for the battery via the battery controller 15 so that the battery 13 is charged during a time slot in which the electric power consumed by the loads 4 is low (or a time slot in which the cost of electricity is low). Therefore, under the control conditions described above, the controller 100 predicts the charge/discharge power characteristics of the battery 13 from the load power characteristics and the generated-power characteristics.

The control for specifying the voltage detection period is described next. When the controller 100 predicts the charge/discharge power characteristics from the load power characteristics and the generated-power characteristics, as described above, the controller 100 determines whether a voltage detection period is included in the predicted charge/discharge power characteristics.

Here, the voltage detection period is a period over which the electric power of the battery 13 is equal to or less than a prescribed power over a prescribed period. The length of the prescribed period is equal to or greater than a time from when the relay switch 12 is turned off until when the voltage between terminals of the battery 13 settles (stabilizes) at an open-circuit voltage. After the relay switch 12 is turned off, the time until the voltage between terminals of the battery 13 (substantially equivalent to a closed-circuit voltage at the point in time when the relay switch 12 was turned off) settles at an open-circuit voltage increases in correspondence with an increase in the deviation between the voltage between terminals of the battery 13 and the open-circuit voltage. Therefore, the size of the current flowing to the battery 13 immediately before the relay switch 12 was turned off is taken into consideration, and a prescribed time is set to a time for a case in which the deviation is greatest or a time longer than the aforementioned time. Alternatively, the prescribed time may be set in accordance with a temperature detected by a temperature sensor (not shown) of the battery 13. The prescribed power is set to zero or a value substantially equivalent to zero.

The controller 100 extracts, from the charge/discharge power characteristics, a period over which the charge/discharge power of the battery 13 is equal to or less than the prescribed power over the prescribed period. In a case in which extraction is possible, the controller 100 then specifies the extracted period as the voltage detection period, and transmits, to the battery controller 15, a control signal indicating that the relay switch 12 is to be turned off for the duration of the voltage detection period and the open-circuit voltage of the battery 13 is to be detected.

The battery controller 15 receives the control signal, and, when the voltage detection period is to start, turns the relay switch 12 off. The battery controller 15 then detects the open-circuit voltage of the battery 13 from the voltage detected by the voltage sensor 14. The open-circuit voltage is detected after the time from the point in time when the relay switch 12 is turned off until when the voltage of the battery 13 settles at an open-circuit voltage. When the voltage detection time elapses, the battery controller 15 then turns the relay switch 12 on.

As shown in FIG. 2, during the midnight-power time slot, the loads 4 are operated using the electric power from the alternating-current power source 1, and the battery 13 is neither charging nor discharging. Therefore, the charge/discharge power of the battery 13 during the aforementioned period is equal to or less than the prescribed power during the prescribed time. Ergo, the controller 100 specifies the voltage detection period within the aforementioned period, and turns the relay switch 12 off and detects the open-circuit voltage via the battery controller 15. This makes it possible in the present example to detect the open-circuit voltage without allowing the supply of power to the loads 4 to become insufficient and without creating a sense of discomfort in a user.

As shown in FIG. 3, the battery is charged during the midnight-power time slot in preparation for the power demand for the next day. The charge/discharge power of the battery 13 will not reach zero in the midnight-power time slot in a case when the SOC of the battery 13 is low and the battery 13 cannot be charged fully in the midnight power time slot even when charged at allowable charging power. In the present example, because the SOC of the battery 13 is managed from the open-circuit voltage of the battery 13, neither the controller 100 nor the battery controller 15 can accurately ascertain the state of the battery 13 when the open-circuit voltage cannot be detected. Therefore, the controller 100 generates the voltage detection time using the control described below.

In a case in which the voltage detection time cannot be specified from the charge/discharge power characteristics, the controller 100 exerts control so that the voltage detection period is subtracted from a time in which it is possible to charge the battery 13 using electric power from the alternating-current power source 1, and so that the battery 13 is charged during the remaining time. The time in which it is possible to charge the battery 13 before the voltage detection time is subtracted is a midnight-power time slot in which the cost of electricity is low or a time slot in which the electric power consumed by the loads 4 from the load power characteristics is low, and is set in advance. Therefore, the actual charge time of the battery 13 is the time obtained by subtracting the voltage detection period from the set time.

The controller 100 predicts, from the predicted load power characteristics and generated-power characteristics, a necessary SOC for the battery 13, and sets the necessary SOC as a target SOC for charging. Because the necessary SOC for the battery 13 increases in correspondence with an increase in the amount of power to be consumed the next day, or in correspondence with a decrease in the amount of generated power for the next day, the controller 100 sets the target SOC to a high value.

In a case in which the electric power for charging the battery 13 to the target SOC during a charging time from which the voltage detection period was subtracted is less than the allowable charging power for the battery 13, the controller 100 transmits, to the battery controller 15, a signal indicating the set target SOC and the charging time. The allowable charging power is set in advance in accordance with the performance of the battery 13, and is the maximum amount of power with which the battery 13 can be charged without affecting the performance of the battery 13.

However, in a case in which the electric power for charging the battery 13 to the target SOC during the charging time is greater than the allowable charging power for the battery 13, the battery cannot be charged. The controller 100 therefore sets the target SOC to a low value and lowers the electric power with which the battery 13 can be charged within the charging time to be equal to or less than the allowable charging power. This makes it possible to generate the voltage detection period and charge the battery 13 in the midnight-power time slot.

The charging time for the battery 13 is also shortened in a case in which the SOC of the battery 13 is high when charging starts for the battery 13 using electric power from the alternating-current power source 1. In such a case, the controller 100 specifies the voltage detection period within a time in which the charging time for the battery 13 is taken from the midnight-power time slot, and turns the relay switch 12 off to detect the open-circuit voltage within the specified period.

The control in the present example as described above will now be described using FIG. 3. As an initial state, the time in which the battery 13 can be charged using the alternating-current power source 1 is set from 23:00 to 5:00 (six hours). The controller 100 first sets the target SOC for the battery 13 from the power demand for the next day. The controller 100 then sets, as the charging time, the time obtained by subtracting the voltage detection period from the time when charging is possible. The charging time is thereby set once the voltage detection period is secured in the time when charging is possible. In the example of FIG. 3, because the voltage detection period (equivalent to period $T_a$ in FIG. 3) is set to 30 minutes, the charging time is set to the five hours and 30 minutes from 23:00 to 4:30, a time in which the 30 minutes of the voltage detection period is taken from the six hours of the time in which charging is possible.

The controller 100 then computes the capacity for charging from the SOC of the battery 13 at 23:00 to the target SOC, and computes, from the capacity and the charging time, the electric power to charge the battery 13. In a case in which the computed charging power is equal to or less than the allowable charging power ($P_L$) for the battery 13, the controller 100 controls the battery controller 15 and charges the battery using the set charging time and the computed charging power. In the example of FIG. 3, because the charging power is equal to or less than the allowable charging power ($P_L$), charging is performed under the conditions described above. After the battery 13 is charged and during period $T_a$, the controller 100 turns the relay switch 12 off and detects the open-circuit voltage via the controller 15.

Figure 4:
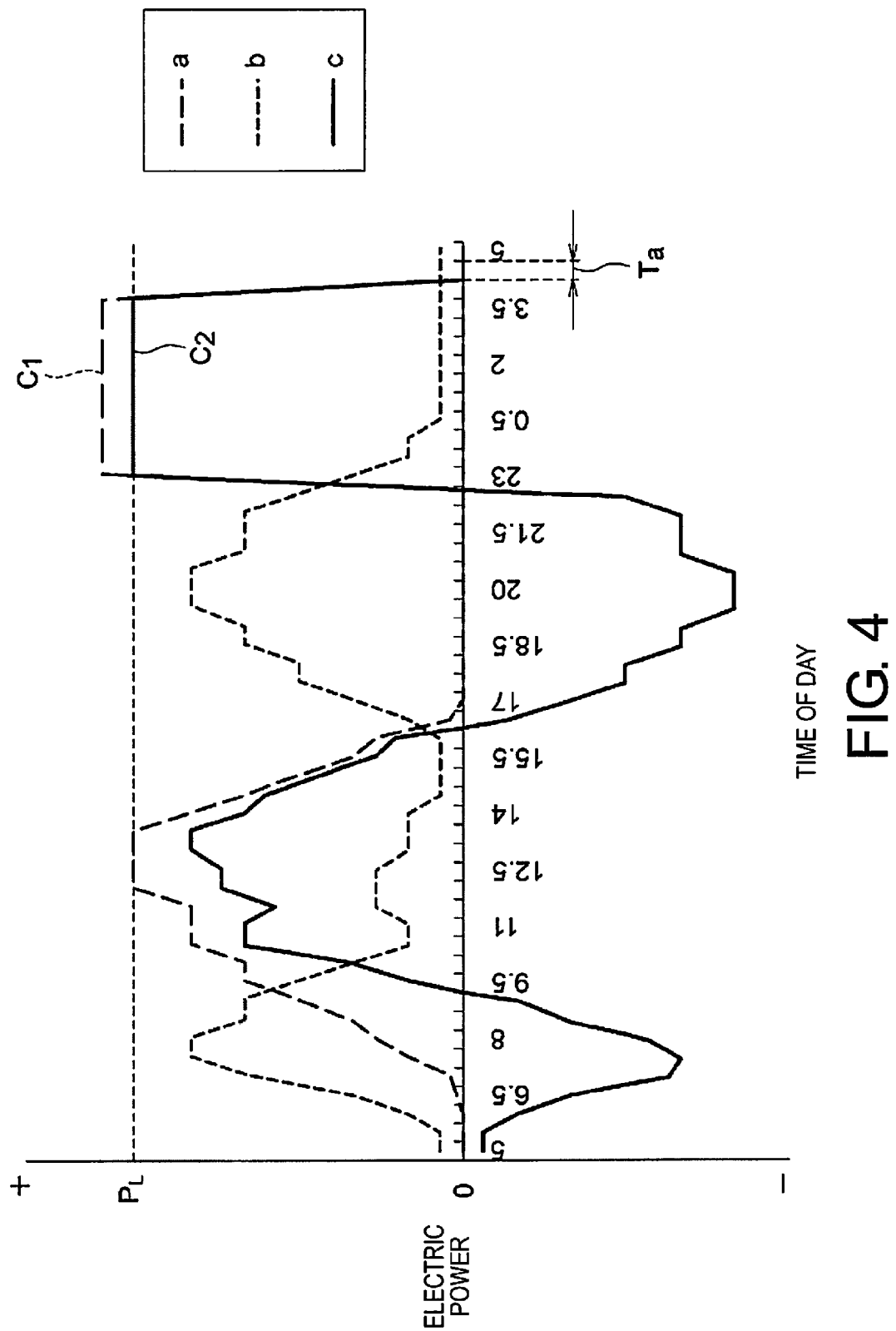
FIG. 4 is a graph showing the generated-power characteristics, the load power characteristics, and the charge/discharge power characteristics of the device for controlling electric power in FIG. 1.

As another example, the control for generating the voltage detection period from among the controls of the present example as described above will be described using FIG. 4. The conditions for setting the time in which charging is possible and the voltage detection time (equivalent to period $T_a$ in FIG. 4) are the same as in FIG. 3. The controller 100 computes the charging time in the manner described above, computes the capacity for charging from the SOC of the battery 13 at 23:00 to the target SOC based on the predicted power demand, and computes the charging power. As shown in graph $c_1$ of FIG. 4, in a case in which the computed charging power is greater than the allowable charging power ($P_L$), the load on the battery 13 is greater than when the battery 13 is charged using the computed charging power. Therefore, the controller 100 lowers the target SOC and exerts control so that the charging power is equal to or less than the allowable charging power. In the example of FIG. 4, the charging time in graph $c_2$ is the same as the charging time in graph $c_1$, but the charging power in graph $c_2$ is set to the allowable charging power. The controller 100 then causes the battery 13 to charge with the characteristics shown in graph $c_2$. After the battery 13 is charged and during period $T_a$, the controller 100 turns the relay switch 12 off and detects the open-circuit voltage via the battery controller 15.

Figure 5:
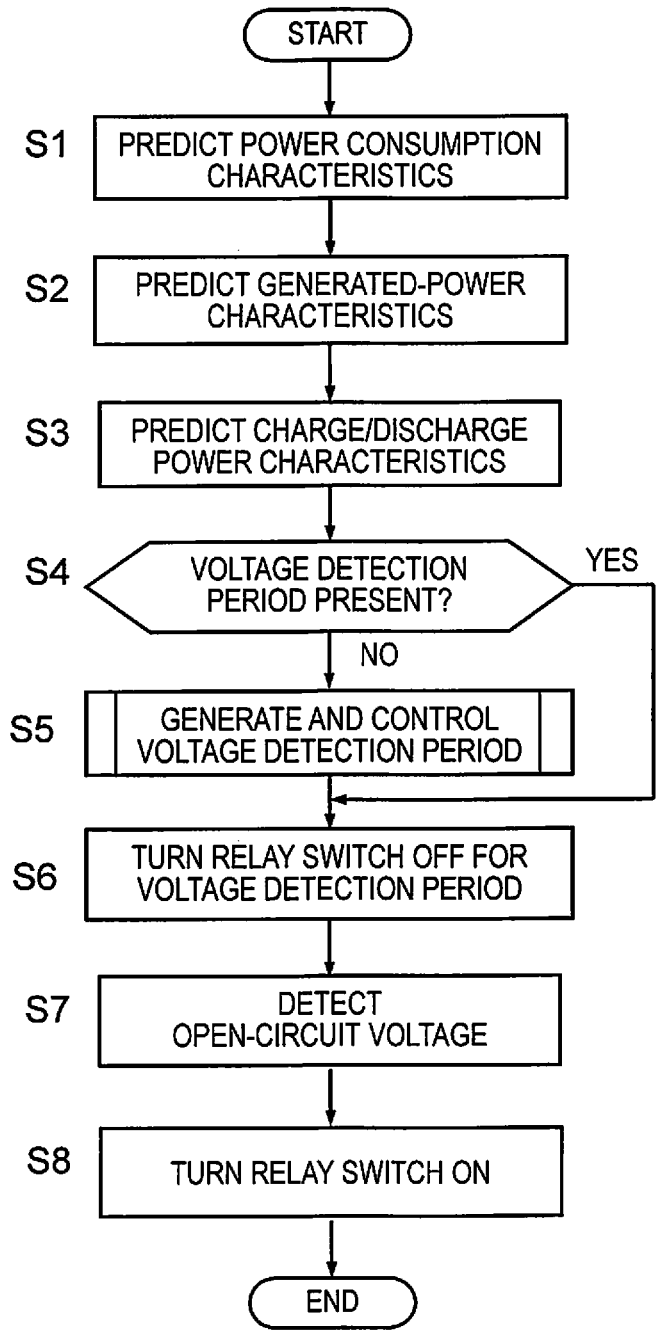
FIG. 5 is a flowchart showing the control sequence of the device for controlling electric power in FIG. 1.
Figure 6:
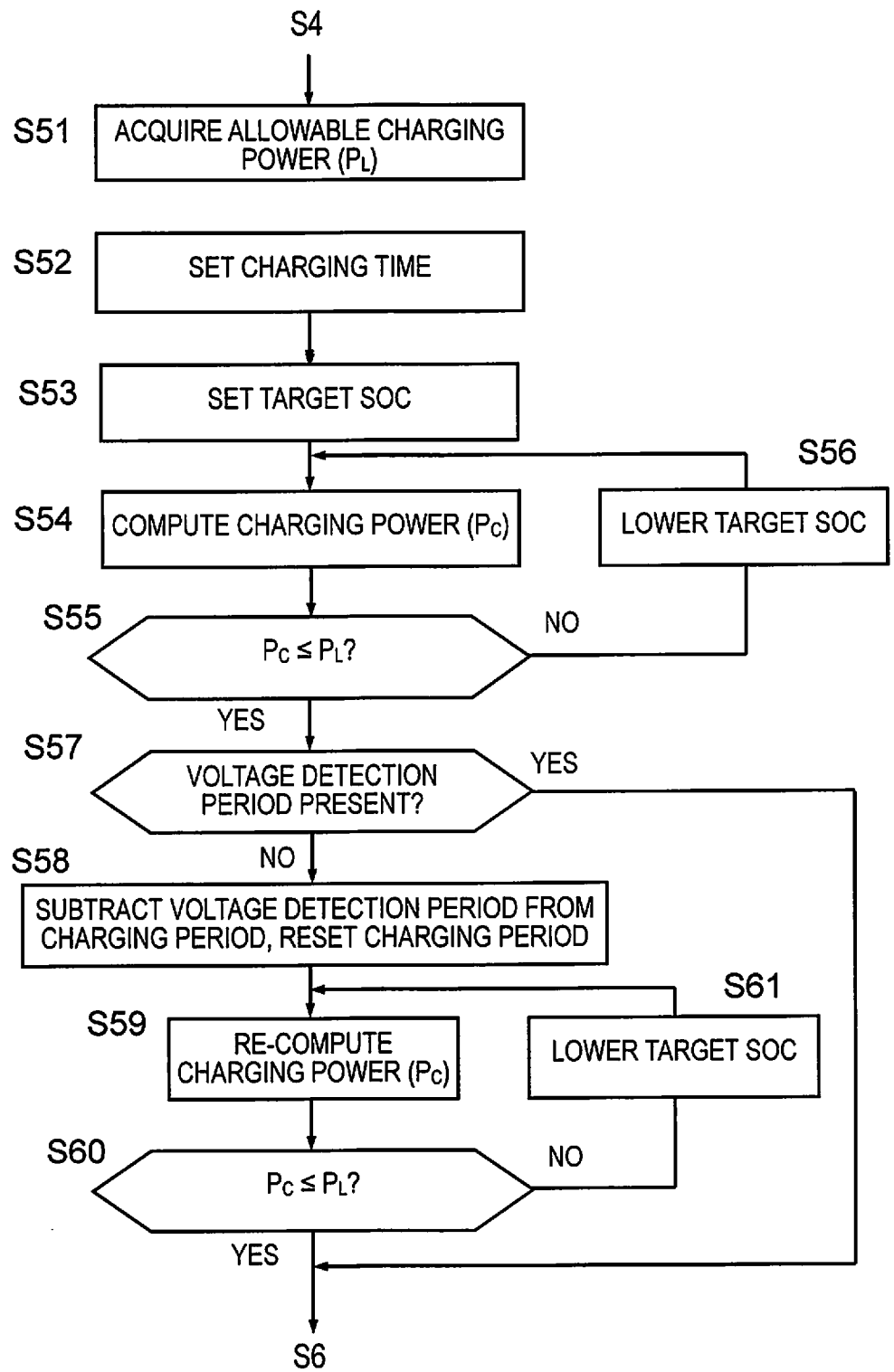
FIG. 6 is a flowchart showing the control sequence of step S5 in FIG. 5.

The control sequence of the controller 100 and the battery controller 15 will be described next using FIGS. 5 and 6. FIGS. 5 and 6 are flowcharts showing the control sequence in the device for controlling electric power of the present example.

As shown in FIG. 5, in step S1, the power consumption prediction unit 101 predicts the load power characteristics of the loads 4. In step S2, the generated-power prediction unit 102 predicts the generated-power characteristics. In step S3, the charge/discharge power prediction unit 103 predicts the charge/discharge power characteristics from the load power characteristics and the generated-power characteristics. In step S4, the controller 100 determines, using the predicted charge/discharge power characteristics, whether there is a period over which the charge/discharge power of the battery 13 is equal to or greater than the prescribed power over the prescribed period, and thereby determines whether a voltage detection period is present. In a case in which no voltage detection period is present, in step S5, the controller 100 exerts control to generate a voltage detection period.

As shown in FIG. 6, in step S51, the controller 100 acquires the allowable charging power ($P_L$). In a case in which the allowable charging power ($P_L$) is set in advance, the set value is used. In step S52, the controller 100 sets the charging time of the battery 13. In a case in which the midnight-power time slot is used and the time in which charging is possible is set in advance, the time in which charging is possible is set as the charging time.

In step S53, the controller 100 predicts the necessary SOC for the battery 13 from the load power characteristics and the generated-power characteristics, and sets the target SOC in accordance with the necessary SOC. In step S54, the controller 100 acquires the spare capacity of the battery 13 from the battery controller 15, and computes the charging power ($P_C$) for charging from a SOC equivalent to the spare capacity to the target SOC during the charging time from step S52.

In step S54, the minimum charging power is set in advance as the charging power of the battery 13. The battery 13 can be charged at or below the minimum charging power, but the charging time will be unacceptably long if the charging power is too low. Therefore, the minimum charging power is set in the present example. In a case in which the charging power ($P_C$) computed in step S54 is lower than the minimum charging power, the controller 100 adjusts the charging time set in S52 to be shorter while setting the charging power of the battery 13 at the minimum charging power.

In step S55, the controller 100 compares the computed charging power ($P_C$) with the allowable charging power ($P_L$). In a case in which the charging power ($P_C$) is greater than the allowable charging power ($P_L$), in step S56, the controller 100 lowers the target SOC set in step S53, and the process transfers to step S54.

In step S57, the controller 100 determines whether a voltage detection period is present. Provided control was not exerted in step S54 to shorten the charging time, the charging time of the battery 13 is equivalent to the time set in advance in which charging is possible; therefore, the process transfers to step S58 at this point in time without there being a voltage detection time. However, when control was exerted in step S54 to shorten the charging time, because a voltage detection period is generated within the period in which charging is possible in the minutes by which the charging time is shorter than the time in which charging is possible, the control in FIG. 6 for generating a voltage detection period finishes, and the process transfers to step S6 in FIG. 5. In a case in which the remaining period in the period in which charging is possible is shorter than the voltage detection period, the process transfers to step S58 even when the charging time has been shortened in step S54.

In step S58, the controller 100 resets, as the charging time, the time obtained by subtracting the voltage detection period from the charging time set during the flow of control before step S55. Using the charging time from step S58, in step S59, the controller once more computes the charging power ($P_C$) for charging from a SOC equivalent to the spare capacity of the battery 13 to the target SOC.

In step S60, the computer 100 compares the computed charging power ($P_C$) with the allowable charging power ($P_L$). In a case in which the computed charging power ($P_C$) is equal to or less than the allowable charging power ($P_L$), the battery 13 goes into a chargeable state with equal to or less than the allowable charging power ($P_L$) for the charging time after generation of the voltage detection time, and the process transfers to step S6. However, in a case in which the charging power ($P_C$) is greater than the allowable charging power ($P_L$), in step S61, the controller 100 lowers the target SOC because the target SOC has still been set to a high value, and the process transfers to step S59. Specifically, after step S58, a target SOC to which the battery 13 can charge within the charging time after generation of the voltage detection time is set by the repetition of the control loop in steps S59 through S61.

Returning to FIG. 5, in step S6, the controller 100 transmits information about the voltage detection time to the battery controller 15, and the battery controller 15 turns the relay switch 12 off during the voltage detection time. In step S7, the battery controller 15 detects the open-circuit voltage by using the voltage sensor 14. In step S8, the battery controller 15 turns the relay switch 12 on after detecting the open-circuit voltage.

The target SOC and the charging time set during the flow of control shown in FIGS. 5 and 6 are transmitted from the controller 100 to the battery controller 15 at a prescribed timing, and the battery controller 15 controls the charging of the battery based on the transmitted target SOC and charging time.

The present invention as described above specifies from the power characteristics predicted by the power consumption prediction unit 101 and the charge/discharge power prediction unit 103 a period, as the voltage detection period, over which the electric power of the battery 13 is equal to or less than the prescribed power over the prescribed period, and turns off the relay switch 12 to detect the open-circuit voltage during the voltage detection period. Because the timing of turning electricity on and off between the battery 13 and the loads 4 is specified upon prediction of the power characteristics, this makes it possible, in a system which is active for 24 hours as in the present example, to detect the open-circuit voltage of the battery 13 while preventing the supply of electric power to the loads 4 from becoming unstable.

The charge/discharge power characteristics are predicted in the present example from the generated-power characteristics and the load power characteristics. Because it is possible to specify the voltage detection period within a period over which the electric power generated by the solar panel 2 or another power-generating device is supplied to the loads 4, this makes it possible to detect the open-circuit voltage of the battery 13 while preventing the supply of electric power to the loads 4 from becoming unstable.

The battery 13 is charged in the present example using electric power from the alternating-current power source 1 during the period obtained by subtracting the voltage detection period from the period in which charging is possible. Because the remaining time once the voltage detection period is secured in the time when charging is possible is used as the charging time, this makes it possible, in a system which is active for 24 hours, to detect the open-circuit voltage of the battery 13 while preventing the supply of electric power to the loads 4 from becoming unstable.

The battery 13 is charged in the present example using electric power from the alternating-current power source during the midnight-power time slot. This makes it possible to keep electricity bills low by charging the battery 13 during a time slot in which the cost of electricity is low and meeting demand during a time slot in which the cost of electricity is high.

The necessary SOC for the battery 13 is predicted in the present example from the load power characteristics, and the target SOC for charging the battery 13 is set in accordance with the predicted SOC. This makes it possible to prevent the amount of power supplied to the loads 4 from diminishing when the battery 13 is charged to an insufficient capacity, or to prevent the battery 13 from being inefficiently charged using the power generated by the solar panel 2 when the battery 13 has insufficient spare capacity.

The prescribed period for the voltage detection period is set in the present example to be equal to or greater than the time from when the relay switch 12 is turned off until when the voltage between terminals of the battery 13 stabilizes. This makes it possible, in a system which is active for 24 hours, to detect the open-circuit voltage after the relay switch 12 is turned off and the voltage of the battery stabilizes.

The solar panel 2 is used in the present example as one example of a power-generating device, but a wind turbine generator or another power-generating device may be used. The device for controlling electric power of the present example may not necessarily use a solar panel 2 or other power-generating device. In a case in which a power-generating device is not used, the battery 13 may discharge during a time slot in which the power consumed by the loads 4 is high, and a control may be performed to charge or discharge the battery 13 so that the battery 13 charges using electric power from the alternating-current power source 1 during a time slot in which the power consumed by the loads 4 is low. The charge/discharge power prediction unit 103 can then ascertain, from the load power characteristics predicted by the power consumption prediction unit 101, the time slots in which the power consumed by the loads is high or low, and can predict the charge/discharge characteristics from the charge/discharge control.

In a case in which the voltage detection period is specified during a daytime time slot, the controller 100 may turn the relay switch 12 off to detect the open-circuit voltage using a daytime voltage detector. The battery controller 15 and the controller 100 may comprise a single controller. With the characteristics shown in FIG. 3 in the present example, the voltage detection period is specified during a nighttime time slot, but in a case in which there is a period during an afternoon time slot over which the electric power of the battery 13 is equal to or less than the prescribed power over the prescribed period, the period in the afternoon may be specified as the voltage detection period, the relay switch 12 may be turned off, and the open-circuit voltage may be detected.

The aforementioned relay switch 12 is equivalent to the "switching means" of the present invention; the power consumption prediction unit 101, generated-power prediction unit 102, and charge/discharge power prediction unit 103 are equivalent to the "predicting means" of the present invention;

the voltage sensor 14 is equivalent to the "detecting means;" the battery controller 15 and the controller 100 are equivalent to the "control means;" and the solar panel 2 is equivalent to the "power-generating means."

Embodiment 2

In the device for controlling electric power according to another embodiment of the present invention, the charge control for the battery and part of the control for generating the voltage detection period differ from those in the first embodiment described above. This embodiment is otherwise of the same configuration as the first embodiment, for which reason the descriptions given previously are adopted here as appropriate.

In the first embodiment, the target SOC for charging is set in accordance with the predicted power characteristics, and the remaining time obtained by subtracting the voltage detection period from the time in which charging is possible is used as the charging time. However, in the present example, the target SOC for charging is set to a SOC equivalent to a fully-charged state, and the charging power is set to the allowable charging power.

The controller 100 sets, as the target SOC, a SOC equivalent to the capacity of the battery 13 when fully charged. The SOC equivalent to the capacity of the battery 13 when fully charged is set to a SOC lower than 100% in order to prevent overcharging of the battery 13. The controller 100 computes the capacity for charging from a SOC equivalent to the spare capacity of the battery 13 to a fully-charged SOC, and computes the charging time from the capacity and the allowable charging power.

The controller 100 determines whether the time obtained by subtracting the charging time from the time in which charging is possible is longer than the voltage detection time. The time in which charging is possible and the voltage detection period are the same times as those according to the first embodiment. In a case in which the time obtained by subtracting the charging time from the time in which charging is possible is longer than the voltage detection time, the controller 100 charges for the computed charging time because the voltage detection period can be specified even when charging occurs to a fully-charged state using the allowable charging power. After the charging time elapses, the controller 100 then turns the relay switch 12 off and detects the open-circuit voltage of the battery 13 via the battery controller 15.

However, in a case in which the time obtained by subtracting the charging time from the time in which charging is possible is shorter than the voltage detection time, the controller 100 sets the target SOC to a SOC lower than the fully-charged SOC to shorten the charging time because the voltage detection period cannot be specified within the time in which charging is possible. The controller 100 then revises the target SOC to be lower, and sets the charging time equal to or less than the time obtained by subtracting the voltage detection period from the time in which charging is possible. This makes it possible to charge the battery upon securing the voltage detection time within the time in which charging is possible.

Figure 7:
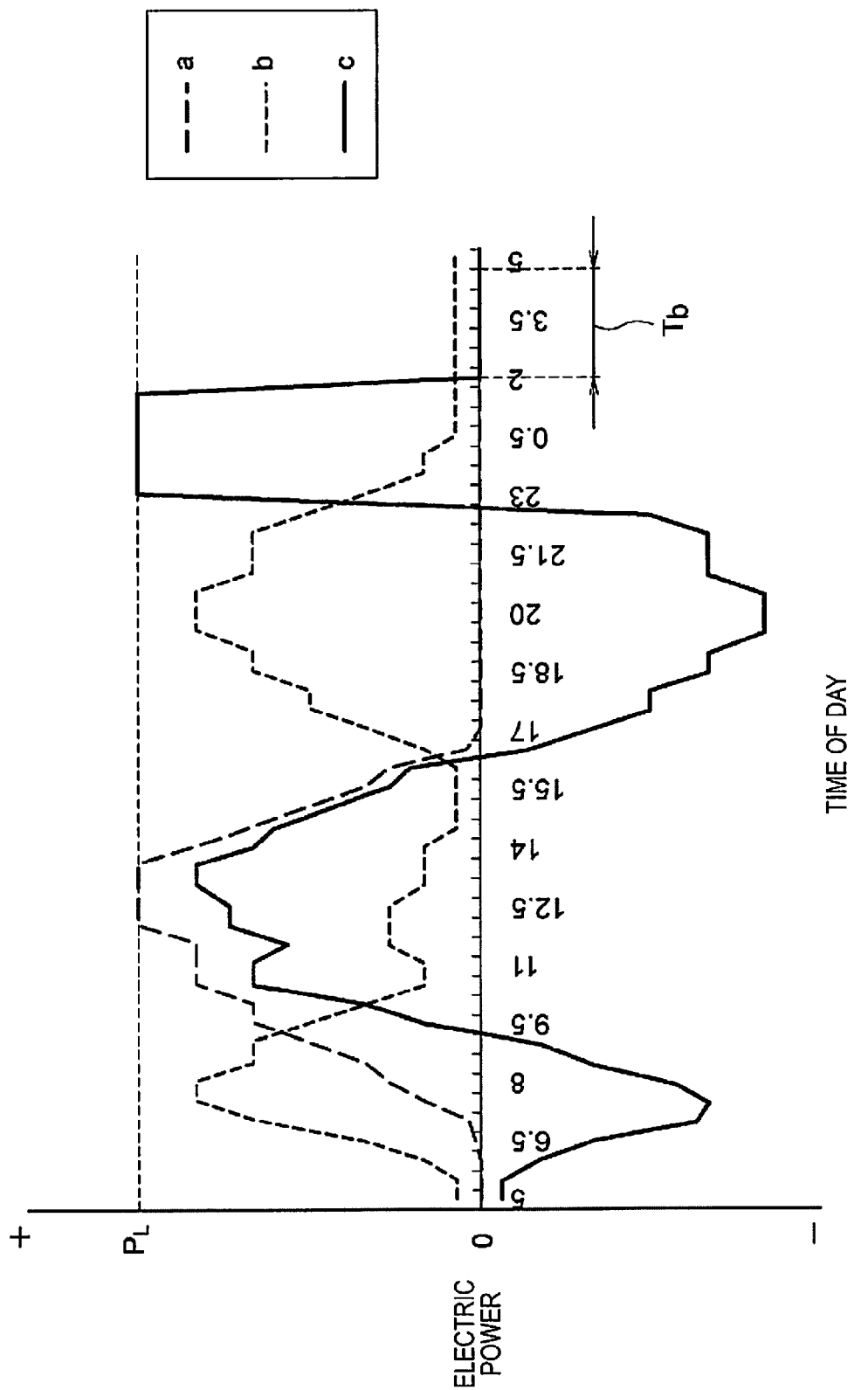
FIG. 7 is a graph showing the generated-power characteristics, the load power characteristics, and the charge/discharge power characteristics of the device for controlling electric power according to another embodiment of the present invention.

FIG. 7 shows the generated-power characteristics, the load power characteristics, and the charge/discharge power characteristics on a certain day. Graphs a through c in FIG. 7 are the same as graphs a through c in FIGS. 2 and 3. The time in which charging is possible is set from 23:00 to 5:00 (six hours). In the example shown in FIG. 7, in a case in which charging occurs from the SOC at 23:00 to a fully-charged SOC using the allowable charging power ($P_L$), the charging time becomes three hours.

The controller 100 initiates charging from 23:00, and charges the battery using the allowable charging power after gradually increasing the charging power. After three hours, the controller finishes charging the battery 13 because the battery 13 achieves a fully-charged SOC.

The controller 100 specifies the voltage detection period within the remaining time in which charging is possible (Tb), and uses the voltage detection period to turn the relay switch 12 off and to detect the open-circuit voltage of the battery 13. At this time, the voltage detection period is set to a constant prescribed period within the time in which charging is possible (Tb), e.g., a prescribed period from when the charging finishes (two hours), or a prescribed period until when the time in which charging is possible finishes (five hours).

In the present example as described above, the time obtained by subtracting the voltage detection period from the time in which charging is possible is set as the charging time, and the battery 13 is charged to a fully-charged state during the charging time. Because the remaining time once the voltage detection period is secured in the time when charging is possible is used as the charging time, this makes it possible, in a system which is active for 24 hours, to detect the open-circuit voltage of the battery 13 while preventing the supply of electric power to the loads 4 from becoming unstable.

In the present example, during charging to a fully-charged state, the charging power is set to the allowable charging power, and charge control is performed under the set conditions when the charging time is equal to or less than the time obtained by subtracting the voltage detection period from the period in which charging is possible. However, provided the condition that the charging time is equal to or less than the time obtained by subtracting the voltage detection period from the period in which charging is possible is fulfilled, the charging power may be set to less than the allowable charging power to charge the battery 13. When the load on the battery 13 during charging is taken into consideration, the charging power is preferably less than the allowable charging power. It is sufficient to detect the open-circuit voltage of the battery 13 at least once after the battery 13 is charged. Therefore, degradation of the battery 13 can be suppressed by lengthening the charging time and lowering the charging power of the battery 13 rather than by extending the voltage detection time beyond what is necessary.

The invention claimed is:

1. A power control device comprising:
a relay switch configured to be connected between a battery for supplying a load with electric power and the load, the relay switch being configured to switch between turning electricity on and off from the battery;
a controller programmed to predict a load power characteristic indicating power consumed by the load over time, and to predict, based on the predicted load power characteristic, a charge/discharge power characteristic indicating power charged/discharged by the battery over time;
a sensor configured to detect voltage between terminals of the battery; and
a battery controller operatively coupled to the relay switch, and programmed to selectively control the relay switch, the controller being programmed to specify a voltage detection period from the charge/discharge power characteristic that was predicted, over which the power charged/discharged by the battery is equal to or less than a prescribed power over a prescribed period, and the battery controller being programmed to turn off the relay switch and to detect an open-circuit voltage based on the voltage between terminals of the battery during the voltage detection period.

2. The power control device according to claim 1, further comprising
power-generating means for generating electric power and charging the battery using the generated electric power;
the controller being further programmed to predict a generated-power characteristic indicating the electric power generated by the power-generating means over time, and
the controller being further programmed to predict the charge/discharge power characteristic from the generated-power characteristic and the load power characteristic.

3. The power control device according to claim 2, further comprising
an external power source capable of charging the battery;
the controller being further programmed to cause the battery to charge using the external power source during a period obtained by subtracting the voltage detection period from a period set in advance in which it is possible to charge the battery using electric power from the external power source.

4. The power control device according to claim 3, wherein the external power source is a commercial power source; and
the controller being further programmed to cause the battery to charge using electric power from a commercial power source during a midnight-power time slot.

5. The power control device according to claim 2, wherein the controller is further programmed to predict a necessary state of charge for the battery from the load power characteristics; and
the controller is further programmed to set a target value for charging the battery, in accordance with the necessary state of charge that was predicted.

6. The power control device according to claim 2, wherein the controller is further programmed to set a charging time period, which is obtained by subtracting the voltage detection period from a period set in advance in which it is possible to charge the battery using electric power from the external power source; and
the controller being further programmed to cause the battery to charge to a fully-charged state during the charging time period.

7. The power control device according to claim 2, wherein the prescribed period is set to be equal to or greater than a period from when the relay switch is turned off until when the voltage between the terminals of the battery stabilizes.

8. The power control device according to claim 1, further comprising
an external power source capable of charging the battery;
the controller being further programmed to cause the battery to charge using the external power source during a period obtained by subtracting the voltage detection period from a period set in advance in which it is possible to charge the battery using electric power from the external power source.

9. The power control device according to claim 8, wherein the external power source is a commercial power source; and
the controller being further programmed to cause the battery to charge using electric power from a commercial power source during a midnight-power time slot.

10. The power control device according to claim 9, wherein the controller is further programmed to predict a necessary state of charge for the battery from the load power characteristics; and
the controller is further programmed to set a target value for charging the battery, in accordance with the necessary state of charge that was predicted.

11. The power control device according to claim 9, wherein the controller is further programmed to set a charging time period, which is obtained by subtracting the voltage detection period from a period set in advance in which it is possible to charge the battery using electric power from the external power source; and
the controller being further programmed to cause the battery to charge to a fully-charged state during the charging time period.

12. The power control device according to claim 9, wherein the prescribed period is set to be equal to or greater than a period from when the relay switch is turned off until when the voltage between the terminals of the battery stabilizes.

13. The power control device according to claim 8, wherein the controller is further programmed to predict a necessary state of charge for the battery from the load power characteristics; and
the controller is further programmed to set a target value for charging the battery, in accordance with the necessary state of charge that was predicted.

14. The power control device according to claim 8, wherein the controller is further programmed to set a charging time period, which is obtained by subtracting the voltage detection period from a period set in advance in which it is possible to charge the battery using electric power from the external power source; and
the controller being further programmed to cause the battery to charge to a fully-charged state during the charging time period.

15. The power control device according to claim 8, wherein the prescribed period is set to be equal to or greater than a period from when the relay switch is turned off until when the voltage between the terminals of the battery stabilizes.

16. The power control device according to claim 1, wherein the controller is further programmed to predict a necessary state of charge for the battery from the load power characteristics; and
the controller is further programmed to set a target value for charging the battery, in accordance with the necessary state of charge that was predicted.

17. The power control device according to claim 1, wherein the controller is further programmed to set a charging time period, which is obtained by subtracting the voltage detection period from a period set in advance in which it is possible to charge the battery using electric power from the external power source; and
the controller being further programmed to cause the battery to charge to a fully-charged state during the charging time period.

18. The power control device according to claim 1, wherein the prescribed period is set to be equal to or greater than a period from when the relay switch is turned off until when the voltage between the terminals of the battery stabilizes.

19. A power control method for controlling electric power comprising:
- predicting a load characteristic indicating electric power consumed by a load over time, the load being driven by electric power supplied from a battery;
- predicting, based on the predicted load power characteristic, a charge/discharge power characteristic indicating power charged/discharged by the battery over time;
- specifying a voltage detection period from the charge/discharge power characteristic that was predicted, over which the power charged/discharged by the battery is equal to or less than a prescribed power over a prescribed period; and
- detecting an open-circuit voltage of the battery based on voltage between terminals of the battery during the voltage detection period in which a relay switch, which turns electricity on and off between the battery and the load, is turned off.

* * * * *